(12) United States Patent
Liu (10) Patent No.: US 8,120,995 B2
(45) Date of Patent: Feb. 21, 2012

(54) ELECTRONIC TIMER WITH GRAPHIC TIME SCALE DISPLAY PANEL

(76) Inventor: Daniel Liu, Taipei County (TW)

( * ) Notice: Subject to any disclaimer, the term of this patent is extended or adjusted under 35 U.S.C. 154(b) by 0 days.

(21) Appl. No.: 13/106,083

(22) Filed: May 12, 2011

(65) Prior Publication Data

US 2011/0211425 A1   Sep. 1, 2011

Related U.S. Application Data (63) Continuation-in-part of application No. 12/144,888, filed on Jun. 24, 2008, now abandoned.

(51) Int. Cl.
*G04B 47/00* (2006.01)
*G04C 23/02* (2006.01)
*H01H 3/34* (2006.01)
*G08B 1/00* (2006.01)

(52) U.S. Cl. ..... 368/10; 368/74; 307/141.4; 340/309.16

(58) Field of Classification Search ............ 368/10, 368/29, 73–74, 240, 250; 307/141, 141.4; 340/309.16, 309.8, 309.9
See application file for complete search history.

(56) References Cited

U.S. PATENT DOCUMENTS

| | | | | |
|---|---|---|---|---|
| 4,193,120 A | * | 3/1980 | Yello | 700/16 |
| 4,204,196 A | * | 5/1980 | Sveda | 340/309.9 |
| 4,387,420 A | * | 6/1983 | Singhi et al. | 700/16 |
| 4,677,310 A | * | 6/1987 | Midorikawa et al. | 307/64 |
| 5,955,796 A | * | 9/1999 | Nilssen | 307/140 |
| 6,011,755 A | * | 1/2000 | Mulhall et al. | 368/10 |
| 6,058,277 A | * | 5/2000 | Streefkerk et al. | 399/81 |
| 6,388,952 B2 | * | 5/2002 | Kim | 368/74 |
| 2005/0094786 A1 | * | 5/2005 | Ossa | 379/111 |
| 2006/0062089 A1 | * | 3/2006 | Lizzi | 368/240 |

* cited by examiner

*Primary Examiner* — Vit Miska
(74) *Attorney, Agent, or Firm* — Rosenberg, Klein & Lee (57) ABSTRACT

An electronic timer graphically displaying programmed ON/OFF settings includes a microprocessor; a time setting unit electrically connected to the microprocessor for a user to set at least one programmed ON/OFF setting for at least one selected day; a memory unit electrically connected to the microprocessor for storing the programmed ON/OFF setting; a clock signal generating unit electrically connected to the microprocessor for generating a clock signal to the microprocessor; and a graphic time scale display unit electrically connected to the microprocessor and including a plurality of time scale segments, each of which represents a predetermined time period. The microprocessor calculates based on the programmed ON/OFF settings to derive all the time scale segments that are corresponding to the programmed ON/OFF settings, and drives the graphic time scale display unit to show the time scale segments corresponding to the programmed ON/OFF settings.

9 Claims, 7 Drawing Sheets

ELECTRONIC TIMER WITH GRAPHIC TIME SCALE DISPLAY PANEL

CROSS-REFERENCES TO RELATED APPLICATIONS

This application is a continuation-in-part of Ser. No. 12/144,888 filed on Jun. 24, 2008, entitled "ELECTRONIC TIMER WITH GRAPHIC TIME SCALE DISPLAY PANEL".

FIELD OF THE INVENTION

The present invention relates to an electronic timer, and more particularly to an electronic timer with a graphic time scale display panel that graphically displays programmed ON/OFF settings by a user.

BACKGROUND OF THE INVENTION

A timer or timing device is frequently used to control the on/off of an electric appliance at a specific time period, to enable automatic control, etc. The currently available timers may be generally divided into two types, namely, mechanical and electronic types. The electronic timers have the advantages of high resolution, accurate timing, large flexibility in weekly applications, etc., and therefore, have gradually taken the place of traditional mechanical timers.

There are many electronic timers on the market today, 7 days weekly timer with up to 14 or more programmed ON/OFF settings per day. However, users need to set each programmed ON and OFF setting respectively, and there is no all programmed ON/OFF settings shown on the display panel after the programmed setting is done. This is most inconvenient for the users.

While it allows a user to set one or more programmed ON/OFF settings for one or more days in a week, the above-described conventional electronic timer is not able to display thereon all of the programmed ON/OFF settings that are set by the user. Therefore, the conventional timer is inconvenient for use, and a user has to take time to check each programmed ON/OFF setting step by step.

Besides, both the currently available mechanical and electronic timers are mostly designed to perform simple periodical ON/OFF settings without considering occasional holiday exception. So, the user has to switch the timer from automatic operation mode to manual operation mode or re-set the timer to perform the occasional holiday activity.

SUMMARY OF THE INVENTION

A primary object of the present invention is to provide an electronic timer with graphical time scale display panel that is able to graphically display the every weekday's programmed ON/OFF settings at the same time, so that the electronic timer is more convenient for use.

The other object of the present invention is to provide an electronic timer with occasional holiday activity control. The timer of the present invention is selectively configurable by the user to set at least one holiday activity setting in a plurality of programmed ON/OFF settings within a predetermined activity cycle time period. The holiday activity setting is performed one time in a defined activity cycle time period and reset at the end of the activity cycle time period.

To fulfill the above object, the present invention provides an electronic timer with graphical time scale display panel. The electronic timer includes a microprocessor; a time setting unit electrically connected to the microprocessor for a user to set at least one programmed ON/OFF setting for at least one selected day; a memory unit electrically connected to the microprocessor for storing the programmed ON/OFF setting; a clock signal generating unit electrically connected to the microprocessor for generating a clock signal to the microprocessor; and a graphic time scale display unit electrically connected to the microprocessor and including a plurality of time scale segments, each of which represents a predetermined time period. The microprocessor calculates based on the programmed ON/OFF settings to derive all the time scale segments that are corresponding to the programmed ON/OFF settings, and drives the graphic time scale display unit to show the time scale segments corresponding to the programmed ON/OFF settings.

In a preferred embodiment of the present invention, at least one regular activity setting is set in the programmed ON/OFF settings, at least one exception setting is set in the programmed ON/OFF settings, and at least one holiday activity setting is set in the programmed ON/OFF settings. The microprocessor is operated in a normal activity mode by retrieving the regular activity setting from the regular activity storing area of the memory unit, operated in an exception mode by retrieving the exception setting from the exception storing area of the memory unit, and operated in a holiday mode by retrieving the holiday activity setting from the holiday activity storing area of the memory unit within the cycle time period. The regular activity setting and the exception setting are periodically performed each time the activity cycle time period is restarted, and the holiday activity setting is performed one time in the activity cycle time period and reset at the end of the activity cycle time period.

With the electronic timer of the present invention, a user needs only to watch the time scale segments lighted or displayed on a graphic time scale display unit to clearly, conveniently, and quickly know all the programmed ON/OFF settings having been set by the user for each selected day.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
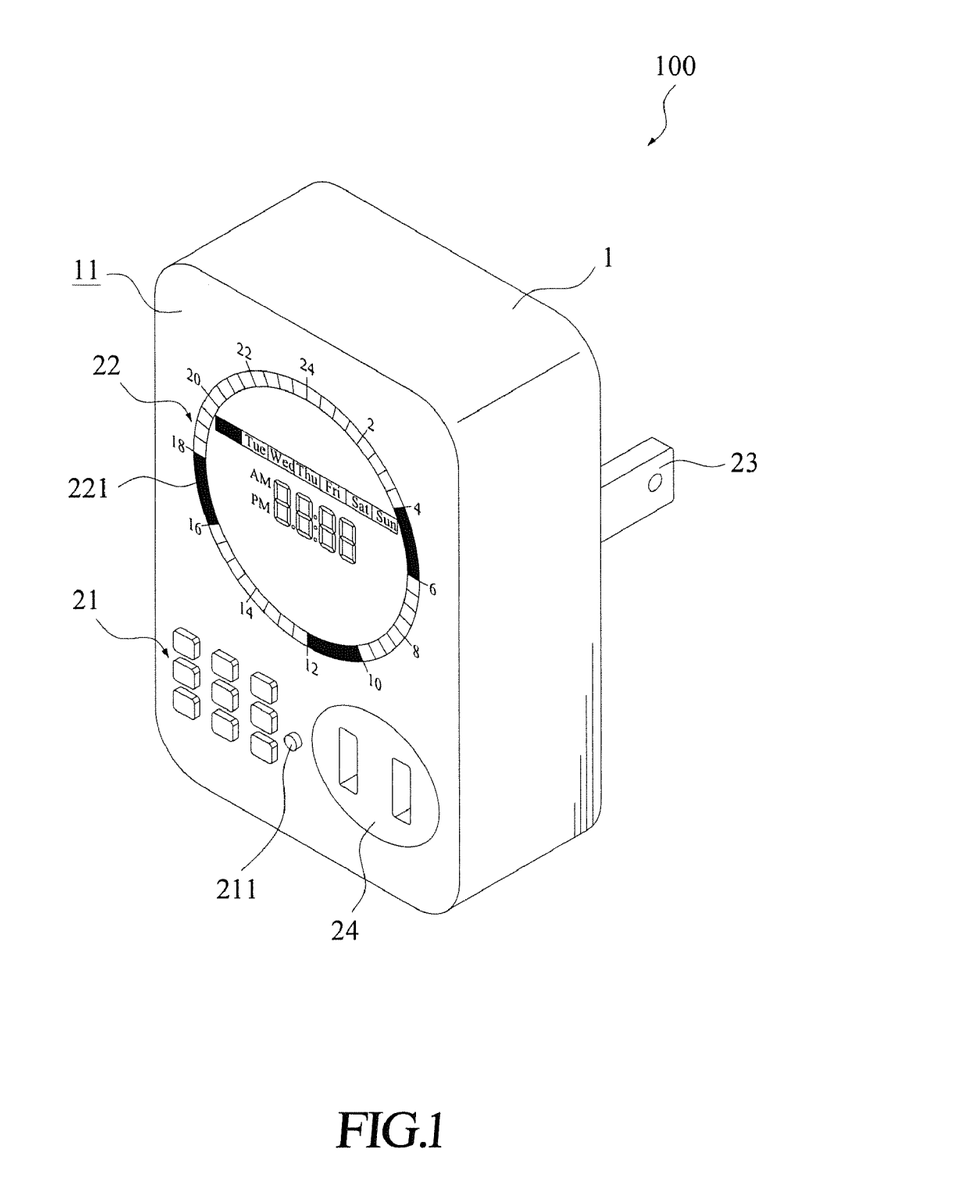
FIG. 1 is a perspective view of an electronic timer with graphic time scale display panel according to a first embodiment of the present invention.

Please refer to FIG. 1. An electronic timer with graphic time scale display panel according to a first embodiment of the present invention is generally denoted a reference numeral 100, and includes a housing 1, a time setting unit 21, a graphic time scale display unit 22, a power input 23, and a power output 24.

The housing 1 includes a display panel 11. The time setting unit 21 is provided on the display panel 11 at a predetermined location thereof for a user to set one or more desired programmed ON/OFF settings for one or more selected days. The programmed ON/OFF settings may be performed on the time setting unit 21 for any day and any number of days. More than one programmed ON/OFF settings may be set for each selected day. The time setting unit 21 further includes a timer on/off key 211 for a user to enable or disable the electronic timer 100.

The graphic time scale display unit 22 is located on the display panel 11 of the housing 1 and includes a plurality of time scale segments 221, each of which represents a predetermined time period. In the illustrated first embodiment of the present invention, the graphic time scale display unit 22 consists of a plurality of light-emitting diodes (LEDs). That is, each of the time scale segments 221 is an LED. The LED time scale segments 221 are used to show the programmed ON/OFF settings via the time setting unit 21.

For example, on the electronic timer 100 shown in FIG. 1, each of the time scale segments 221 represents a time period of 30 minutes, and three programmed ON/OFF settings of 04:00~6:00, 10:00~12:00, and 16:00~18:00 are set by the user for Monday. That is, total 12 LEDs are lighted to show the three different programmed ON/OFF settings. The user may also set other programmed ON/OFF settings for a different day, such as sets two different programmed ON/OFF settings of 09:00~10:00 and 16:00~17:00 for Tuesday, or sets one or more different programmed ON/OFF settings for each day from Monday to Sunday. The user needs only to watch the time scale segments 221 on the graphic time scale display unit 22 to easily know all the programmed ON/OFF settings having been set by the user.

The power input 23 for the electronic timer 100 is a plug provided to a rear face of the housing 1 for plugging into an AC (alternating current) power supply; and the power outlet 24 is a socket provided to the display panel 11 of the housing 1 for an electric appliance to plug therein. When the programmed ON/OFF settings are reached, external power supplied to the power input 23 is transferred to the power outlet 24 and thereby supplied to the electric appliance plugged in the power outlet 24. With this design, the electronic timer 100 of the present invention may be mounted on a wall to replace a conventional power switch and serve as a switch with timer function.

Figure 2:
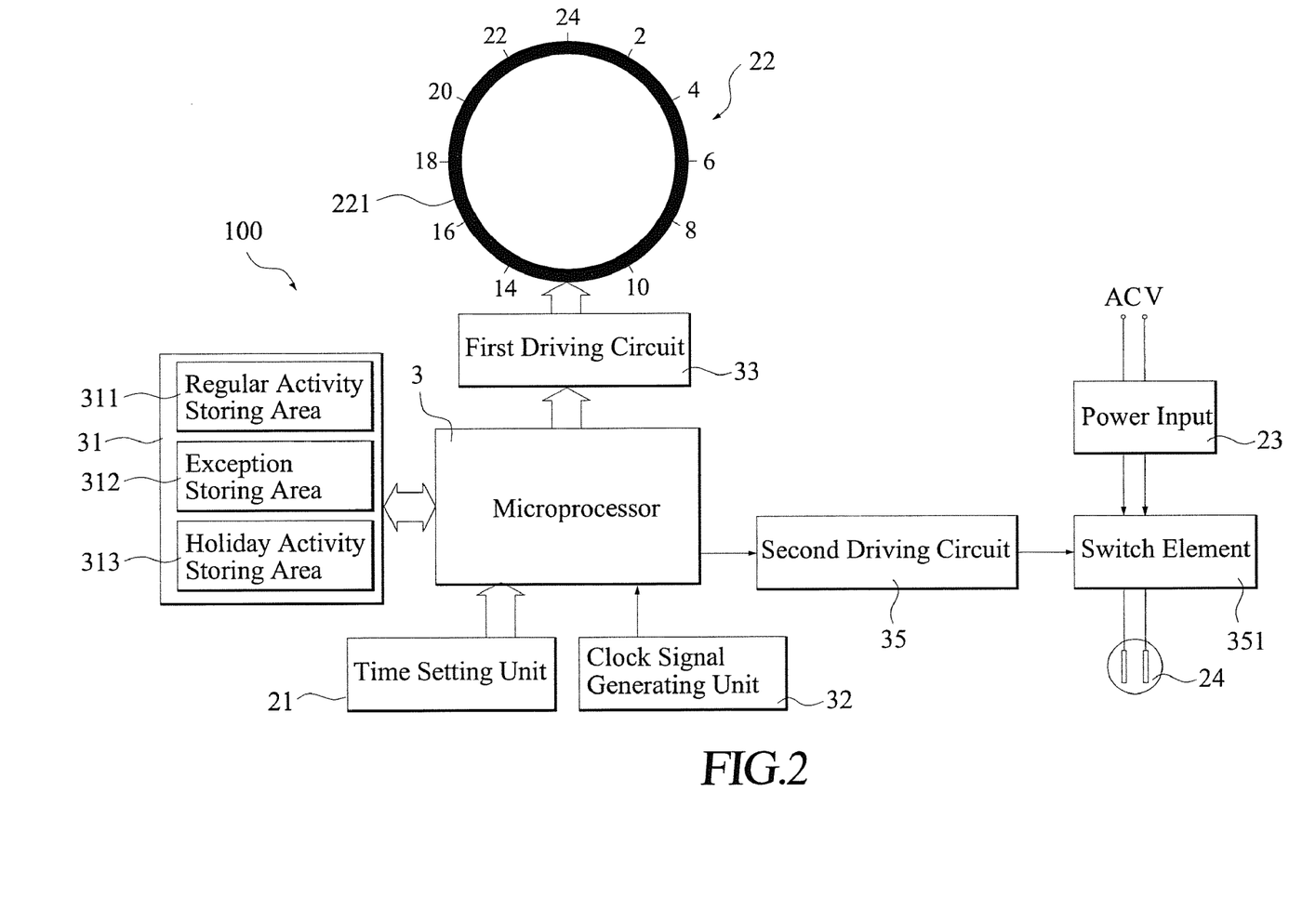
FIG. 2 is a block diagram showing a control circuit of the timer of FIG. 1.

Please refer to FIG. 2 that is a block diagram showing a control circuit of the electronic timer 100. As shown, the control circuit for the electronic timer 100 includes the time setting unit 21, the graphic time scale display unit 22, a microprocessor 3, a memory unit 31, a clock signal generating unit 32, a first driving circuit 33, and a second driving circuit 35. The time setting unit 21, the memory unit 31, the clock signal generating unit 32, and the first and the second driving circuits 33, 35 are electrically connected to the microprocessor 3. The graphic time scale display unit 22 is connected to the microprocessor 3 via the first driving circuit 33. The second driving circuit 35 is also electrically connected to a switch element 351, which is electrically connected to the power input 23 and the power output 24.

The programmed ON/OFF are stored on the memory unit 31 via the microprocessor 3. The microprocessor 3 calculates based on the programmed ON/OFF settings to derive all the time scale segments 221 that are corresponding to the programmed ON/OFF settings, and thereby causes the first driving circuit 33 to drive the graphic time scale display unit 22 to lighten the time scale segments 221 corresponding to the programmed ON/OFF settings. That is, the LEDs representing the time periods from 04:00~06:00, 10:00~12:00 and 16:00~18:00 are lighted. The clock signal generating unit 32 is used to generate a clock signal to the microprocessor 3.

When the programmed ON/OFF settings of 04:00~06:00, 10:00~12:00 and 16:00~18:00 on Monday set by the user are reached, the microprocessor 3 sends a driving signal to the second driving circuit 35 for the same to drive the switch element 351 to transfer the AC power supply connected to the plug-shaped power input 23 to the socket-shaped power output 24, so that electronic power is supplied to the electric appliance plugged in the socket-shaped power output 24.

Figure 3:
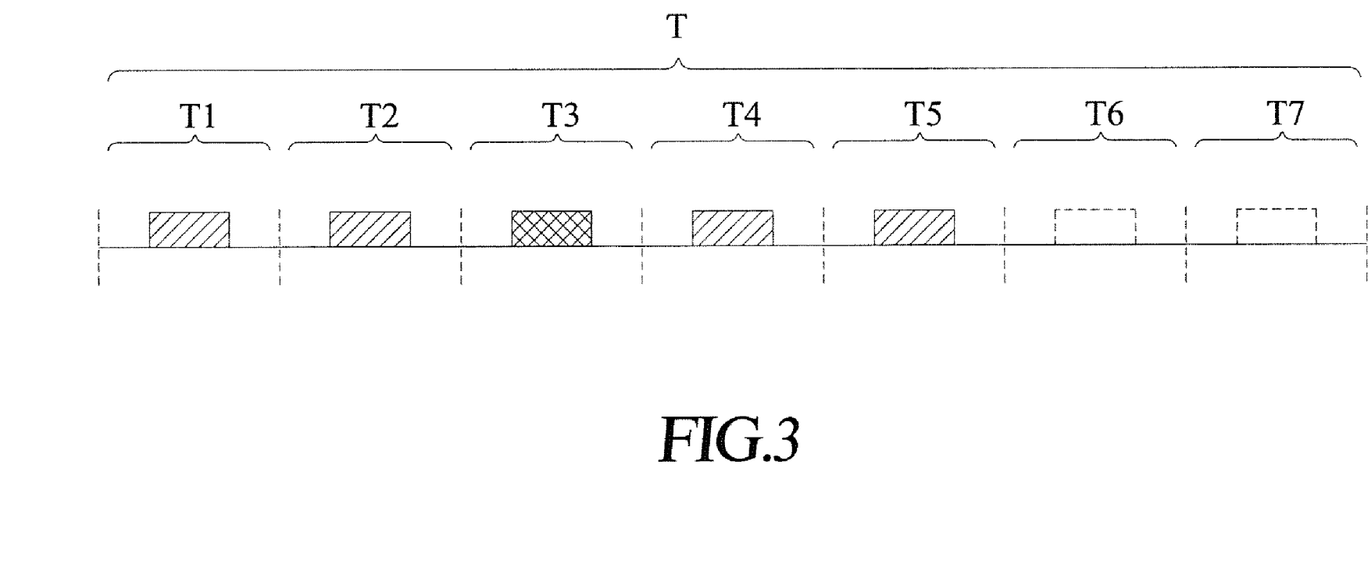
FIG. 3 shows four regular activity settings, two exception settings, and a holiday activity setting are set within a predetermined activity cycle time period in accordance with a preferred embodiment of the present invention.

In a preferred embodiment of the present invention, with reference to FIGS. 2 and 3, the time setting unit 21 is selectively configurable by a user to set a plurality of programmed ON/OFF settings T1, T2, T3, T4, T5, T6, and T7 within a predetermined cycle time period T, for example from Monday to Sunday in a week. The programmed ON/OFF settings T1, T2, T3, T4, T5, T6, and T7 may be defined by the user to perform a desired work at a specific time period, for example one week or one month.

In the programmed ON/OFF settings T1, T2, T3, T4, T5, T6, and T7, the user may selectively set one or more regular activity settings, such as ON/OFF settings T1, T2, T4, and T5, and set one or more exception settings, such as ON/OFF settings T6 and T7 as indicated in FIG. 3. The exception settings T6 and T7 is responsive to an exception task adverse to the regular activity settings T1, T2, T4, and T5.

For example, the regular activity is set to regularly turn on an electrical appliance from AM 08:00~12:00 on Monday to Friday, as indicated by cross-sectional lines in FIG. 3, while Saturday and Sunday are set as an exception settings and not to perform the regular activity.

Further, the user may selectively set one or more holiday activity settings, such as ON/OFF settings T3 as indicated in FIG. 3. The holiday activity setting T3 is responsive to a specific holiday within the predetermined cycle time period T.

The regular activity settings, such as ON/OFF settings T1, T2, T4, and T5 are stored in a regular activity storing area 311 of the memory unit 31, the exception settings T6 and T7 are stored in an exception storing area 312 of the memory unit 31, and the holiday activity setting T3 is stored in an holiday activity storing area 313 of the memory unit 31.

The microprocessor 3 is operated in a normal activity mode by retrieving the programmed ON/OFF settings from the regular activity storing area 311 of the memory unit 31. The microprocessor 3 is capable of identifying the masked programmed ON/OFF settings, and correspondingly operated in an exception mode by retrieving the exception setting from the exception activity storing area 312 of the memory unit 31.

The microprocessor 3 is operated in a normal activity mode by retrieving the regular activity settings T1, T2, T4, and T5 from the regular activity storing area 311 of the memory unit 31, operated in an exception mode by retrieving the exception settings T6 and T7 from the exception storing area 312 of the memory unit 31, and operated in a holiday mode by retrieving the holiday activity setting T3 from the holiday activity storing area 313 of the memory unit 31 within the cycle time period T. The regular activity setting T1, T2, T4, and T5 and the exception settings T6 and T7 are periodically performed each time the activity cycle time period T is restarted, and the holiday activity setting T3 is performed one time in the activity cycle time period T and will be reset at the end of the activity cycle time period T. That is, the holiday activity setting T3 is performed in the first activity cycle time period and is not performed in the sequential activity cycle time periods after the first activity cycle time period.

In this embodiment, the microprocessor 3 calculates based on the programmed ON/OFF settings and the exception settings to derive the time scale segments 221 that are corresponding to the programmed ON/OFF settings and the exception settings, and thereby causes the first driving circuit 33 to drive the graphic time scale display unit 22 to display the corresponding time scale segments 221.

The microprocessor 3 derives all the time scale segments 221 that are corresponding to the regular settings, the exception settings, and the holiday activity settings, and thereby causes the first driving circuit 33 to drive the graphic time scale display unit 22 to display the corresponding time scale segments 221.

Figure 4:
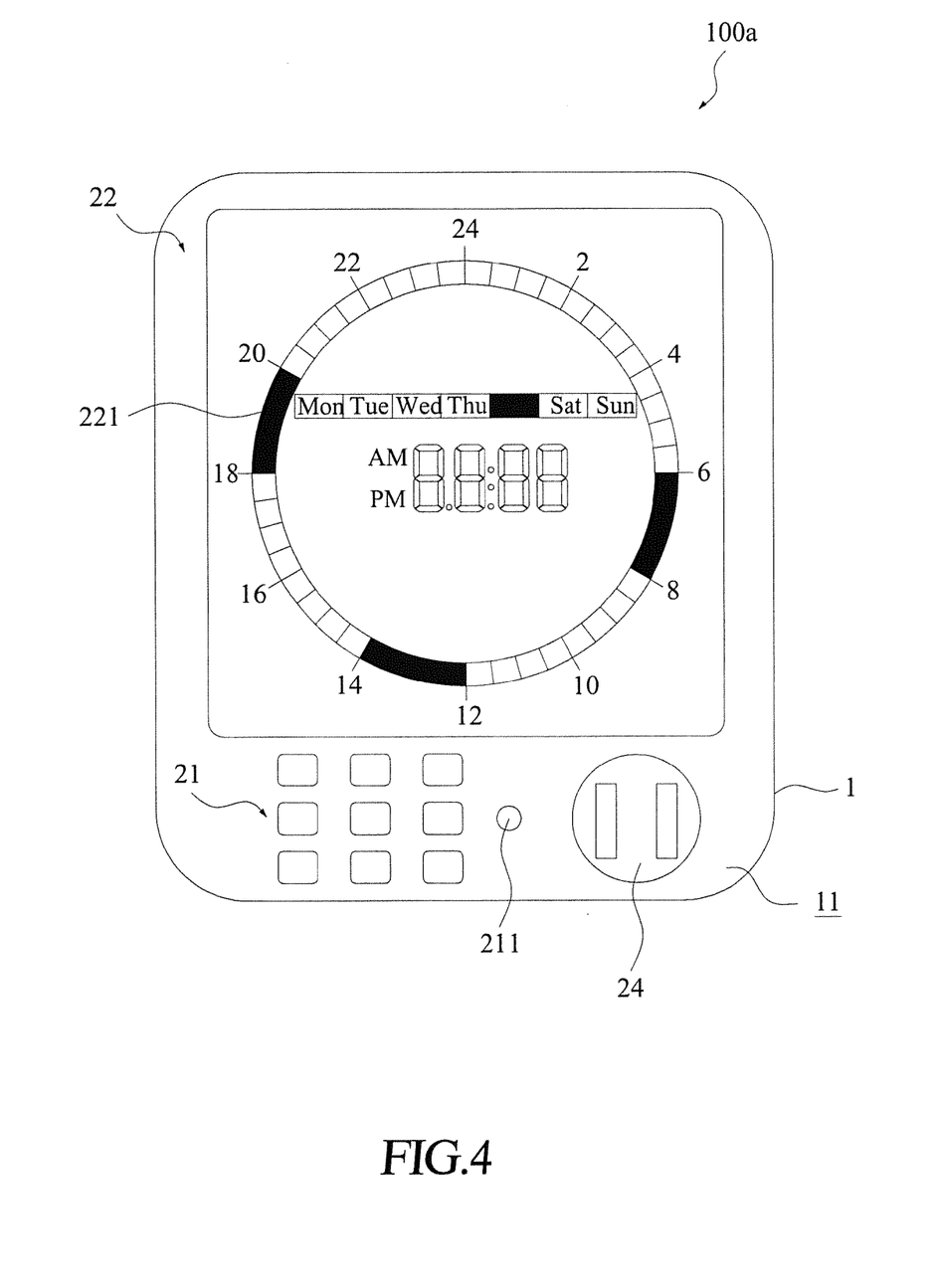
FIG. 4 is a front view of an electronic timer with graphic time scale display panel according to a second embodiment of the present invention.

Please refer to FIG. 4 that is a front view of an electronic timer with graphic time scale display panel according to a second embodiment of the present invention. The electronic timer according to the second embodiment of the present invention is generally denoted a reference numeral 100a, and is generally structurally similar to the first embodiment. Therefore, the same reference numerals are denoted to parts that are the same in the two embodiments. The electronic timer 100a is different from the electronic timer 100 in that the graphic time scale display unit 22 is a liquid crystal display (LCD), and the time scale segments 221 are time scale graphs on the LCD. On the electronic timer 100a shown in FIG. 4, three programmed ON/OFF settings of 06:00~08:00, 12:00~14:00, and 18:00~20:00 are set by the user for Friday.

Figure 5:
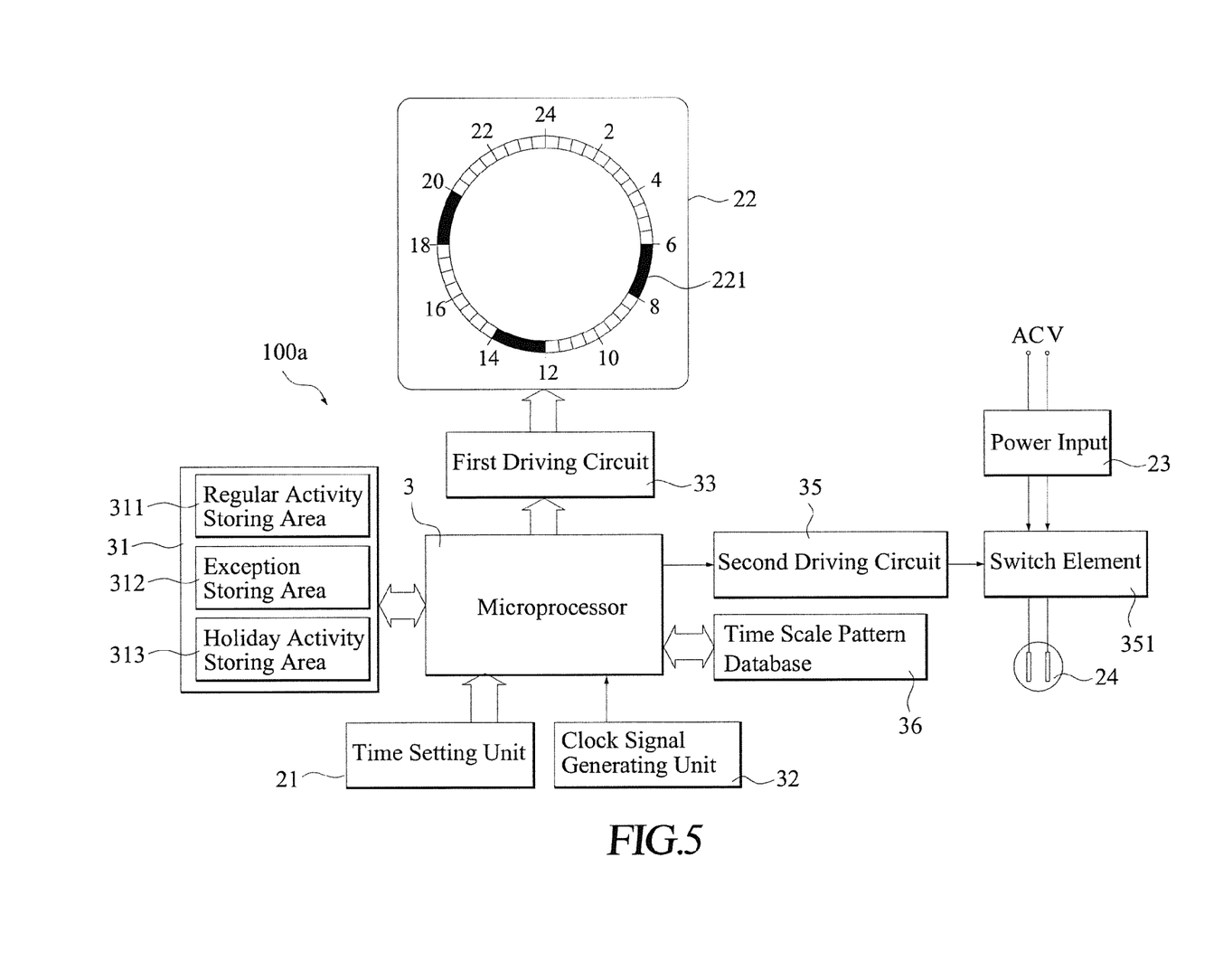
FIG. 5 is a block diagram showing a control circuit of the electronic timer of FIG. 4.

Please refer to FIG. 5 that is a block diagram showing a control circuit of the electronic timer 100a. The control circuit of the electronic timer 100a is generally similar to that of the electronic timer 100. Therefore, the same reference numerals are denoted to parts that are the same in the two control circuits. The control circuit of the electronic timer 100a is different from the control circuit of the electronic timer 100 in an additional time scale pattern database 36 electrically connected to the microprocessor 3. The time scale pattern database 36 has time scale graphic data stored therein. The microprocessor 3 calculates based on the programmed ON/OFF settings stored on the memory unit 31 to derive all the time scale segments 221 that are corresponding to the stored programmed ON/OFF settings, and reads out the time scale graphic data in the time scale pattern database 36 that correspond to the derived time scale segments 221. Then, based on the corresponding time scale graphic data, the microprocessor 3 drives the graphic time scale display unit 22 to display the corresponding time scale segments 221 representing the time periods of 06:00~08:00, 12:00~14:00, and 18:00~20:00.

Figure 6:
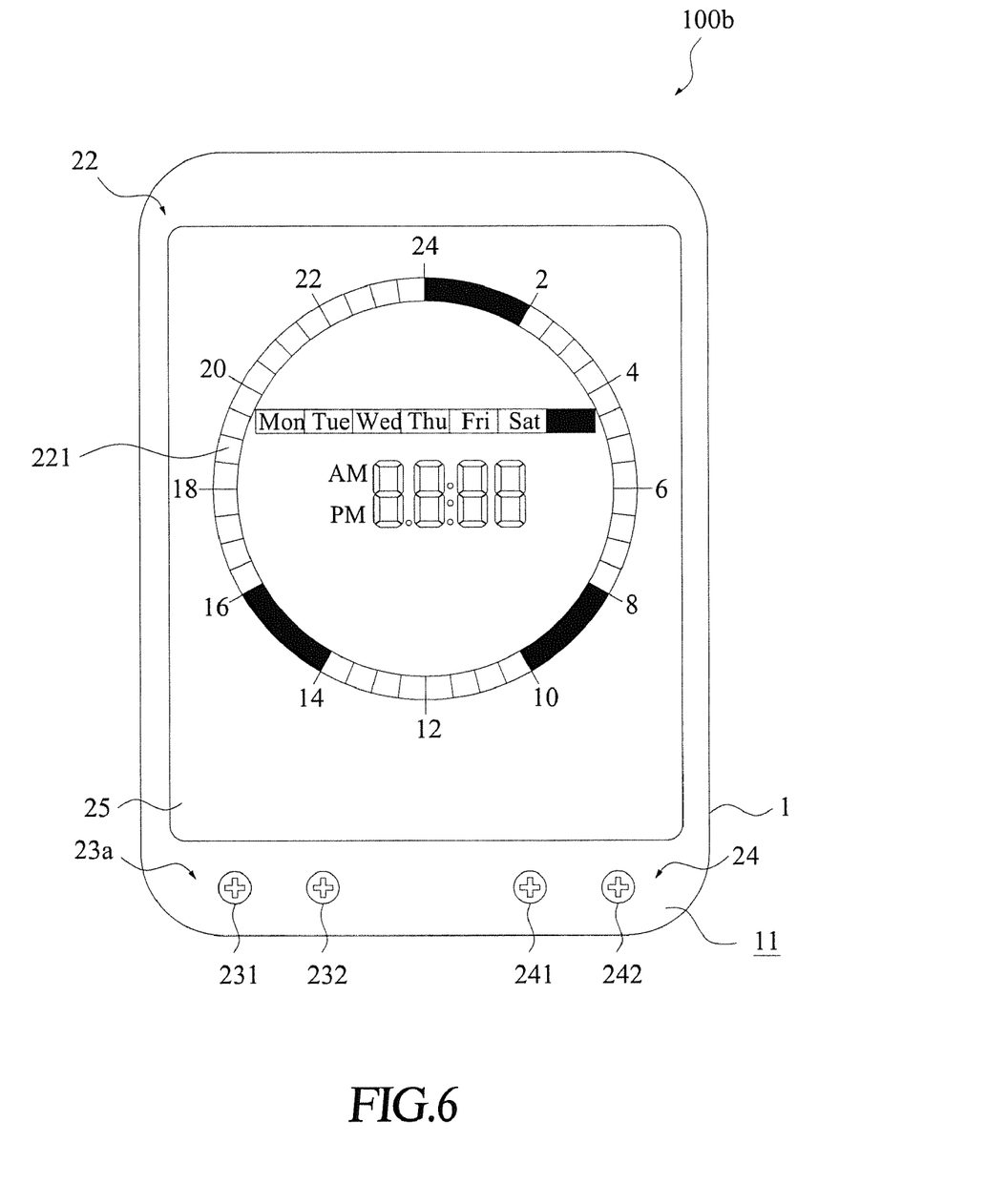
FIG. 6 is a front view of an electronic timer with graphic time scale display panel according to a third embodiment of the present invention.
Figure 7:
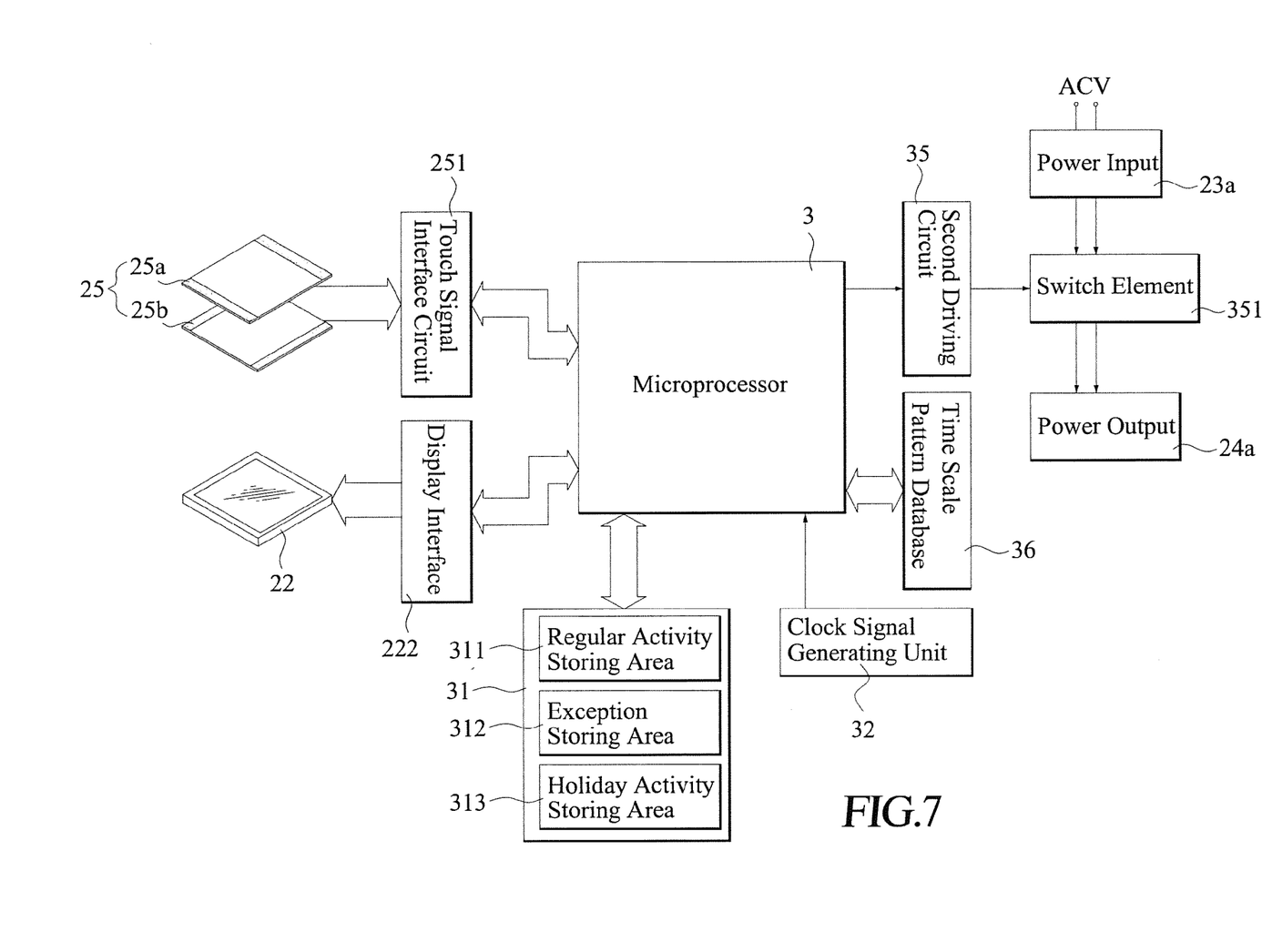
FIG. 7 is a block diagram showing a control circuit of the electronic timer of FIG. 6.

FIGS. 6 and 7 show an electronic timer with graphic time scale display panel according to a third embodiment of the present invention. The electronic timer according to the third embodiment of the present invention is generally denoted a reference numeral 100b, and is generally structurally similar to the second embodiment. Therefore, the same reference numerals are denoted to parts that are the same in the two embodiments. The electronic timer 100b is different from the electronic timer 100a in a touch panel 25 that replaces the time setting unit 21 in the second embodiment. The touch panel 25 is correspondingly provided on the graphic time scale display unit 22, which is an LCD and is electrically connected to the microprocessor 3 via a display interface 222. In the third embodiment, the electronic timer 100b includes a power input 23a in the form of a pair of power input connecting terminals 231, 232; and a power output 24a in the form of a pair of power output connecting terminals 241, 242.

The touch panel 25 includes an upper touch layer 25a and a lower touch layer 25b both in the form of a thin film, and is electrically connected to the microprocessor 3 via a touch signal interface circuit 251. A user may set one or more programmed ON/OFF settings by touching the touch panel 25. Meanwhile, calculation of programmed ON/OFF settings is activated. That is, when the user touches the upper and lower touch layers 25a, 25b, a touch signal is generated. The touch signal is detected and digitalized by the touch signal interface circuit 251 before being sent to the microprocessor 3.

The power input connecting terminals 231, 232 are used to connect to an external power supply; the power output connecting terminals 241, 242 are used to connect an electric appliance 4 thereto. On the electronic timer 100b shown in FIG. 6, three programmed ON/OFF settings of 00:00~02:00, 08:00~10:00, and 14:00~16:00 are set by the user for Sunday. When the three programmed ON/OFF settings are reached, the microprocessor 3 sends a driving signal to the second driving circuit 35 for the same to turn on the switch element 351, allowing the external power supply to the power input connecting terminals 231, 232 to be transferred to the power output 24a, so that electronic power is supplied to the electric appliance 4 connected to the power output connecting terminals 241, 242. With these arrangements, the electronic timer of the present invention may be mounted to a power receptacle to replace the latter and provide a socket with timer function.

Although the present invention has been described with reference to the preferred embodiments thereof, a variety of modifications and changes may be made without departing from the scope of the present claimed invention.

What is claimed is:

1. An electronic timer, comprising:
a microprocessor;
a time setting unit electrically connected to the microprocessor, the time setting unit being selectively configurable by a user to set a plurality of programmed ON/OFF settings within a predetermined activity cycle time period, at least one regular activity setting being set in the programmed ON/OFF settings and at least one holiday activity setting being set in the programmed ON/OFF settings;
a memory unit electrically connected to the microprocessor, having a regular activity storing area for storing the regular activity setting and a holiday activity storing area for storing the holiday activity setting;
a clock signal generating unit electrically connected to the microprocessor for generating a clock signal to the microprocessor; and
a graphic time scale display unit electrically connected to the microprocessor and including a plurality of time scale segments, and each of the time scale segments representing a predetermined time period;
wherein the microprocessor is operated in a normal activity mode by retrieving the regular activity setting from the regular activity storing area of the memory unit, and operated in a holiday mode by retrieving the holiday activity setting from the holiday activity storing area of the memory unit within the cycle time period;
wherein the regular activity setting is periodically performed each time the activity cycle time period is restarted, and the holiday activity setting is performed one time in the activity cycle time period and reset at the end of the activity cycle time period; and wherein the microprocessor derives all the time scale segments that are corresponding to the regular setting and the holiday activity setting, and thereby drives the graphic time scale display unit to display the corresponding time scale segments.

2. The electronic timer as claimed in claim 1, further comprising a power input, a switch element, and a power output; the power input being provided for connecting to an external power supply; the switch element being electrically connected to the microprocessor, the power input, and the power output; and the power output being provided for an electrical appliance to connect thereto; whereby when the programmed ON/OFF settings are reached, the microprocessor sends a driving signal to turn on the switch element, so that the external power supply connected to the power input is transferred to the power output for supplying to the electric appliance connected to the power output.

3. The electronic timer as claimed in claim 1, wherein the graphic time scale display unit comprises a plurality of LEDs.

4. The electronic timer as claimed in claim 1, further comprising a time scale pattern database electrically connected to the microprocessor and having time scale graphic data stored therein; and wherein the graphic time scale display unit is an LCD, and the microprocessor calculates based on the regular setting and the holiday activity setting to derive all the time scale segments that are corresponding to the regular setting and the holiday activity setting, reads out the time scale graphic data in the time scale pattern database that are corresponding to the derived time scale segments, and drives the graphic time scale display unit based on the corresponding time scale graphic data.

5. The electronic timer as claimed in claim 1, wherein the programmed ON/OFF settings further comprise at least one exception setting, the memory unit further comprises an exception storing area for storing the exception setting, and the microprocessor is operated in an exception mode by retrieving the exception setting from the exception storing area of the memory unit;

wherein the exception setting are periodically performed each time the activity cycle time period is restarted; and wherein the microprocessor derives all the time scale segments that are corresponding to the exception setting, and thereby drives the graphic time scale display unit to display the corresponding time scale segments.

6. An electronic timer, comprising:
a microprocessor;
a touch panel electrically connected to the microprocessor, the touch panel being selectively configurable by a user to set a plurality of programmed ON/OFF settings within a predetermined cycle time period, at least one regular activity setting being set in the programmed ON/OFF settings and at least one holiday activity setting being set in the programmed ON/OFF settings;
a memory unit electrically connected to the microprocessor, having a regular activity storing area for storing the regular activity setting and a holiday activity storing area for storing the holiday activity setting;
a clock signal generating unit electrically connected to the microprocessor for generating a clock signal to the microprocessor;
a time scale pattern database electrically connected to the microprocessor and having time scale graphic data stored therein; and
a graphic time scale display unit electrically connected to the microprocessor and including a plurality of time scale segments, and each of the time scale segments representing a predetermined time period;
wherein the microprocessor is operated in a normal activity mode by retrieving the regular activity setting from the regular activity storing area of the memory unit, and operated in a holiday mode by retrieving the holiday activity setting from the holiday activity storing area of the memory unit within the cycle time period;
wherein the regular activity setting is periodically performed each time the activity cycle time period is restarted, and the holiday activity setting is performed one time in the activity cycle time period and reset at the end of the activity cycle time period; and
wherein the microprocessor derives all the time scale segments that are corresponding to the regular setting and the holiday activity setting, and thereby drives the graphic time scale display unit to display the corresponding time scale segments.

7. The electronic timer as claimed in claim 6, further comprising a power input, a switch element, and a power output; the power input being provided for connecting to an external power supply; the switch element being electrically connected to the microprocessor, the power input, and the power output; and the power output being provided for an electrical appliance to connect thereto; whereby when the programmed ON/OFF settings are reached, the microprocessor sends a driving signal to turn on the switch element, so that the external power supply connected to the power input is transferred to the power output for supplying to the electrical appliance connected to the power output.

8. The electronic timer as claimed in claim 6, wherein the graphic time scale display unit is an LCD.

9. The electronic timer as claimed in claim 6, wherein the programmed ON/OFF settings further comprise at least one exception setting, the memory unit further comprises an exception storing area for storing the exception setting, and the microprocessor is operated in an exception mode by retrieving the exception setting from the exception storing area of the memory unit;

wherein the exception setting are periodically performed each time the activity cycle time period is restarted; and wherein the microprocessor derives all the time scale segments that are corresponding to the exception setting, and thereby drives the graphic time scale display unit to display the corresponding time scale segments.

* * * * *